(12) United States Patent
Harding

(10) Patent No.: US 11,768,408 B2
(45) Date of Patent: Sep. 26, 2023

(54) THIN-FILM TRANSISTOR (TFT) ARCHITECTURE FOR LIQUID CRYSTAL DISPLAYS

(71) Applicant: Flexenable Limited, Cambridge (GB)

(72) Inventor: James Harding, Cambridge (GB)

(73) Assignee: Flexenable Technology Limited, Cambridge (GB)

(*) Notice: Subject to any disclaimer, the term of this patent is extended or adjusted under 35 U.S.C. 154(b) by 606 days.

(21) Appl. No.: 16/632,814

(22) PCT Filed: Jul. 20, 2018

(86) PCT No.: PCT/EP2018/069772
§ 371 (c)(1),
(2) Date: Jan. 21, 2020

(87) PCT Pub. No.: WO2019/016373
PCT Pub. Date: Jan. 24, 2019

(65) Prior Publication Data
US 2021/0157206 A1     May 27, 2021

(30) Foreign Application Priority Data
Jul. 21, 2017   (GB) ...................... 1711786

(51) Int. Cl.
*G02F 1/1368*   (2006.01)
*G02F 1/1343*   (2006.01)
*G02F 1/1339*   (2006.01)

(52) U.S. Cl.
CPC .... *G02F 1/134363* (2013.01); *G02F 1/13685* (2021.01); *G02F 1/13394* (2013.01)

(58) Field of Classification Search
None
See application file for complete search history.

(56) References Cited

U.S. PATENT DOCUMENTS

| 6,215,541 B1 | 10/2001 | Song et al. |
| 2009/0261334 A1 | 10/2009 | Ahn |

(Continued)

FOREIGN PATENT DOCUMENTS

| CN | 102629570 A | 8/2012 |
| CN | 103018977 A | 4/2013 |

(Continued)

OTHER PUBLICATIONS

International Search Report and Written Opinion in International Patent Application No. PCT/EP2018/069772 dated Oct. 2, 2018.

(Continued)

*Primary Examiner* — Thanh Nhan P Nguyen
(74) *Attorney, Agent, or Firm* — Dergosits & Noah LLP; Todd A. Noah

(57) ABSTRACT

A device having a stack of layers defining source and pixel conductors at a first level, gate and common conductors at a second level, semiconductor channels between the source and pixel conductors and gate dielectric capacitively coupling the semiconductor channels to the gate conductors. The pixel and common conductors are configured such that, in use, a change in potential difference between the pixel and common conductors in a pixel region induces a change in one or more optical properties of a liquid crystal material in the pixel region.

18 Claims, 2 Drawing Sheets

(56) References Cited

U.S. PATENT DOCUMENTS

| | | | |
|---|---|---|---|
| 2010/0165281 A1* | 7/2010 | Ahn | G02F 1/134363 349/147 |
| 2010/0295049 A1* | 11/2010 | Yoo | H01L 27/1214 438/34 |
| 2014/0091331 A1 | 4/2014 | Ning et al. | |
| 2016/0216584 A1 | 7/2016 | Lee et al. | |

FOREIGN PATENT DOCUMENTS

| | | |
|---|---|---|
| JP | H07 28063 A | 1/1995 |
| JP | H09 269497 A | 10/1997 |
| KR | 20040012200 A | 2/2004 |
| WO | 2013071800 A1 | 5/2013 |

OTHER PUBLICATIONS

Search Report in Great Britain Patent Application No. 1711786.2 dated Jan. 18, 2019.

* cited by examiner

THIN-FILM TRANSISTOR (TFT) ARCHITECTURE FOR LIQUID CRYSTAL DISPLAYS

CLAIM OF PRIORITY

This patent application is a U.S. National Phase of International Patent Application No. PCT/EP2018/069772, filed Jul. 20, 2018, which claims priority to Great Britain Patent Application No. 1711786.2, filed Feb. 21, 2017, each of which is incorporated by reference in its entirety.

FIELD OF THE INVENTION

The liquid crystal (LC) mode known as the fringe-field switching (FFS) mode involves inducing a rotation of the LC director of a liquid crystal material by changing the potential difference between pixel and common electrodes arranged at different levels on the same side of the liquid crystal material.

The FFS mode is characterised by relatively low operating voltages and relatively high transmittance compared to other LC modes such as the in-plane switching (IPS) mode.

The production of an FFS device may involve building a stack of layers defining the pixel and common electrodes and an active-matrix array of TFTs for varying the electric potential at the pixel electrode for a pixel relative to the electric potential at the common electrode. Conventionally, the pixel and common electrodes are located at a different level within the stack to the TFT conductors.

The inventor for the present application has developed a new architecture for FFS display devices.

There is hereby provided a device, comprising a stack of layers defining: source and pixel conductors at a first level; gate and common conductors at a second level; semiconductor channels between said source and pixel conductors; and gate dielectric capacitively coupling said semiconductor channels to said gate conductors; wherein said pixel and common conductors are configured such that, in use, a change in potential difference between the pixel and common conductors in a pixel region induces a change in one or more optical properties of a liquid crystal material in the pixel region.

According to one embodiment, the device comprises at least two conductor patterns at said second level, which two conductor patterns have different designs and exhibit different optical and/or electrical properties.

According to one embodiment, said gate conductors are defined at least partly by at least a first one of said two conductor patterns; and said common conductors are defined at least partly by only a second one of said two conductor patterns.

According to one embodiment, the first conductor pattern exhibits a higher electrical conductivity than the second conductor pattern, and the second conductor pattern exhibits a higher visible light transmittance than the first conductor pattern.

According to one embodiment, the device comprises at least two conductor patterns at said first level, which two conductor patterns have different designs and exhibit different optical and/or electrical properties.

According to one embodiment, said source conductors are defined at least partly by both of said two conductor patterns at said first level; and said pixel conductors are both defined at least partly by only a second one of said two conductor patterns.

According to one embodiment, the first conductor pattern exhibits a higher electrical conductivity than the second conductor pattern, and the second conductor pattern exhibits a higher visible light transmittance than the first conductor pattern.

There is also hereby provided a display device, comprising a liquid crystal material contained between a device as described above and a counter component; wherein said pixel and common conductors are configured such that, in use, a change in potential difference between pixel and common conductors in a pixel region induces a change in one or more optical properties of the liquid crystal material in the pixel region.

BRIEF DESCRIPTION OF THE DRAWINGS

Embodiments of the present invention are described hereunder, by way of example only, with reference to the accompanying drawings, in which.

DETAILED DESCRIPTION

In the following detailed description, the term "pixel conductor" refers to the conductor/electrode that is connected to the driver chip via a semiconductor channel and a conductor referred to here as the "source conductor", i.e., the conductor that is electrically downstream of the semiconductor channel relative to the driver chip. The pixel conductor may also be referred to as the TFT drain conductor/electrode.

Figure 1:
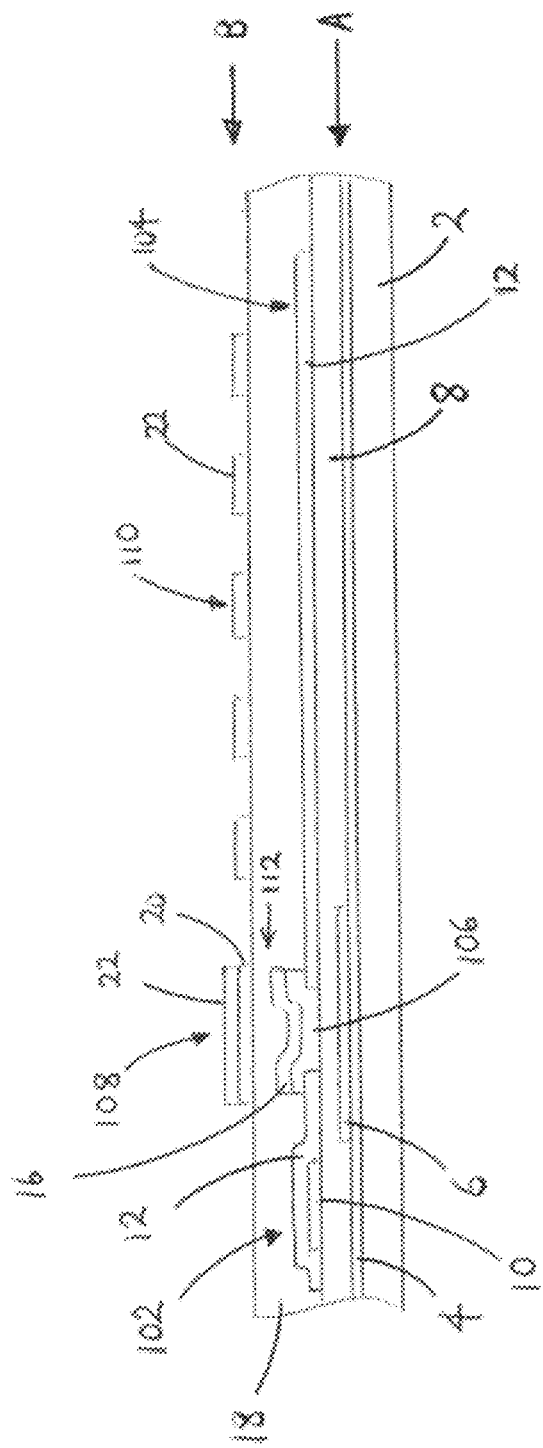
FIG. 1 illustrates a device according to a first embodiment of the present invention.

With reference to FIG. 1, a support substrate 2 supports a stack of layers defining at least (i) the FFS electrodes for an array of pixels, (ii) the thin-film transistors for controlling the electric potential at the pixel electrode for each pixel, and (iii) the circuitry (not shown in full) for addressing each thin-film transistor from one or more driver chips (not shown) arranged, e.g., at the periphery of the array. For clarity and conciseness, FIG. 1 only shows the architecture for one pixel, but the same architecture is substantially repeated for each pixel across the entire array.

Two conductor patterns 10, 12 (having different 2D designs, and comprising different conductor materials or different combinations of conductor materials) at a conductor level A of the stack define source conductors 102 and pixel conductors 104 connected via semiconductor channels 106. Two conductor patterns 20, 22 (having different 2D designs, and comprising different conductor materials or different combinations of conductor materials) at an upper conductor level B of the stack define the gate conductors 108 and common conductors 110. The gate conductors 108 are capacitively coupled to the semiconductor channels 106 via a gate dielectric 112, and a change in the electrical potential at the gate conductor 108 induces a change in the charge carrier mobility of the semiconductor channels.

The source conductors 102 comprise a set of conductors each connected to a respective output terminal of a source driver chip (not shown) and each providing the source conductor for a respective row of pixels; and the gate conductors 108 also comprise a set of conductors each connected to a respective output terminal of a gate driver chip (not shown) and each providing the gate conductor for a respective column of pixels (wherein the terms column and row here simply indicate substantially orthogonal relative directions, without limitation to any absolute directions). Accordingly, the electric potential at each pixel conductor 104 (relative to the electric potential at the common conductor 110) can be controlled independently of all other pixel conductors 104, by virtue of the unique combination of gate and source driver output terminals associated with the pixel conductor 104.

The common conductors 110 for all pixels are all connected to a common terminal (not shown) at a periphery of the array, for holding all common conductors 110 for all pixels at a substantially constant electric potential.

Figure 2:
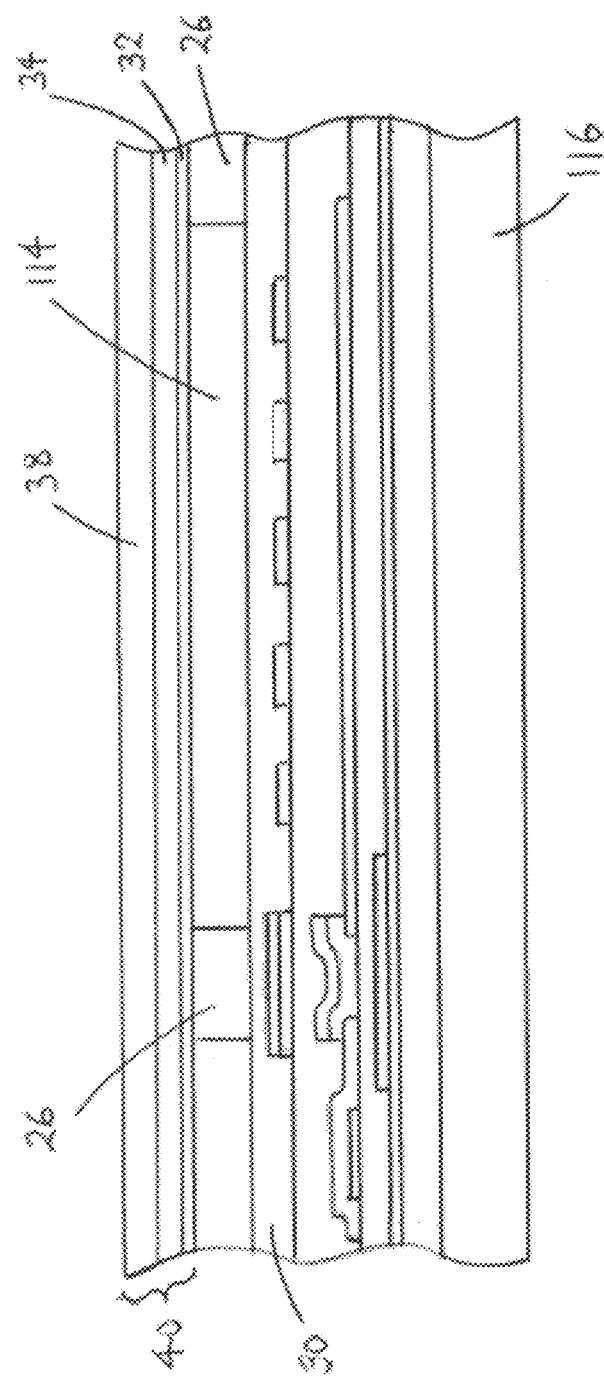
FIG. 2 illustrates the device of FIG. 1 incorporated into a liquid crystal cell assembly.

The device of FIG. 1 is designed for use in a transmissive-type display in which a change in the electric potential between the pixel and common electrodes 104, 110 for a pixel controls (via a rotation of the LC director of the liquid crystal material 114 in the pixel region) the amount of light transmitted from a backlight 116 provided on the opposite side of the device of FIG. 1 to the liquid crystal material 114, as shown in FIG. 2. When using semiconductor materials (such as some organic polymer semiconductor materials) that are sensitive to the light emitted by the backlight 116, the device may further comprise a patterned reflective layer 6 between conductor level A and the backlight 116 (e.g. between conductor level A and the support substrate 2, as in FIG. 1), which protects the semiconductor channels 106 from light emitted by the backlight.

In a LC display device, the above-described control device of FIG. 1 is combined with a carefully controlled thickness of liquid crystal material 114 contained between the control device of FIG. 1 and a counter element 40, which may comprise a support film 38 supporting a colour filter array 34 to provide a colour display from a white backlight 116. Spacers 26 are provided between the control device and the counter element 40 to better achieve a uniform thickness of liquid crystal material across the whole of the viewing area of the display device. Photoalignment layers 30, 32 are provided on the opposing surfaces of the control device and counter element 40 to create a fixed electric field that statically controls the orientation of the LC director of the liquid crystal material in the absence of any electric potential difference between the pixel and common electrodes 104, 110. The spacers 26 may, for example, be formed by photolithographically patterning a layer of spacer material deposited over the upper surface of the control device (followed by formation of a photoalignment layer 30 over the upper surface of the control device).

In one example, the common conductors 110 for a pixel comprise a set of spaced parallel sub-conductors, and the pixel conductor 104 occupies at least all of the area directly underneath the sub-conductors and all of the area directly underneath the spaces between the sub-conductors.

Next, one example of a method for producing the device of FIG. 1 is described below.

A stack of layers is built on a support substrate 2, such as, e.g., a flexible plastic support film. During the construction of the stack, the support substrate 2 may itself be temporarily secured to a more rigid carrier (e.g., a glass carrier) by means of a releasable adhesive.

A top surface of a plastic support film 2 is coated with one or more planarization layers 4 to provide a harder, more scratch resistant, and smoother upper surface on which to build the stack of layers. Next, one or more metal/metal alloy layers are deposited by a vapour deposition technique and patterned by photolithography to define a patterned reflector 6 that shields the semiconductor channels 106 from the backlight 116.

Next, the upper surface is coated with one or more further planarization layers to provide a smoother surface for forming the next conductor pattern 10.

A first layer of conductor material having a relatively high electrical conductivity and a relatively low visible light transmittance is deposited over the upper surface by a vapour deposition technique such as sputtering and patterned by, e.g., photolithography. This first conductor pattern 10 defines source conductor lines, each source conductor line providing part of the source conductor for a respective row of pixels and extending from one edge of the array to an opposite edge of the array for connection to a respective source driver chip terminal.

A second layer of conductor material having a relatively low electrical conductivity but higher visible light transmittance is deposited over the upper surface and patterned to form the pixel conductors 104 and part of the source conductor for each pixel. This second conductor pattern 12 has a different two-dimensional design to the first conductor pattern 10; different masks are used to create the first and second conductor patterns 10, 12. The second conductor pattern 12 overlaps with the first conductor pattern 10 in the regions of the source conductor lines, but additionally defines an extra part of the source conductor 102 for each pixel, in closest proximity to the pixel conductor 104 for each pixel, where the semiconductor channels 106 are provided for each pixel. The second conductor pattern 12 may include interdigitated parts where the source and pixel conductors 102, 104 are in closest proximity for a pixel, in order to increase the width of the semiconductor channel 106 over which the source and pixel conductors 102, 104 are in closest proximity.

Next, a self-assembled monolayer (SAM) of charge-injection organic polymer material (not shown) is selectively formed on the parts of the upper surface where the second conductor pattern 12 exists, to facilitate the movement of charge carriers between the source conductor 102 and the organic semiconductor channel 106 and/or between the pixel conductor 104 and the organic semiconductor channel 106.

Next, a layer of organic polymer semiconductor material is formed over the whole of the upper surface, and a layer of organic polymer gate dielectric material is formed over the whole of the upper surface of the layer of semiconductor material. These two layers are then patterned together by photolithography to define islands of semiconductor material (capped with gate dielectric material 16) that each provide the semiconductor channel 106 for a respective pixel. Providing a first layer of gate dielectric material 16 on the semiconductor material before this semiconductor patterning process facilitates the production of a good semiconductor-dielectric interface for the TFT.

Next, a second layer of organic polymer gate dielectric material 18 is formed over the entire upper surface. In one embodiment, the second layer of gate dielectric material 18 is formed of a material that is more resistant than the first layer of gate dielectric material 16 to the process (described above) for patterning conductor layers at conductor level B.

Next, a first layer of conductor material having a relatively high electrical conductivity and a relatively low visible light transmittance is deposited over the upper surface by a vapour deposition technique such as sputtering and patterned by photolithography. The resulting first conductor pattern 20 at level B defines an array of parallel line conductors, each providing the gate conductor 108 for a respective column of pixels, and each extending from one edge of the array to an opposite edge of the array for connection to a respective gate driver chip terminal.

A second layer of conductor material having a relatively low electrical conductivity but higher visible light transmittance is deposited over the upper surface and patterned by photolithography. The resulting second conductor pattern 22 at conductor level B has a different two-dimensional design to the first conductor pattern 20; different masks are used to create the first and second conductor patterns. The second conductor pattern 22 defines the common conductors 110. This second conductor is also retained in the regions of the first conductor pattern 20 (gate conductor lines 108) to avoid any risk of the patterning process used to define the common conductors 110 having the undesirable side-effect of removing part of the gate conductor lines 108. The common conductors 110 for all pixels are connected to a common power terminal at a periphery of the array to hold all common conductors at substantially the same electric potential.

The common and pixel conductors 110, 104 are designed such that a change in electric potential between the common and pixel conductors for a pixel can create an electric field that induces/triggers a rotation of the LC director for the liquid crystal material 114 in the pixel region that is sufficient to switch the liquid crystal material in the pixel region between two states that transmit substantially different proportions of the light from the backlight 116.

As mentioned above, the device of FIG. 1 is designed for a transmissive-type device; and the second conductor patterns at conductor levels A and B (i.e., the conductor patterns 12, 22 that define the common conductors 110 and the pixel conductors 104) exhibit a relatively high transmittance (compared to the underlying first conductor patterns 10, 20 that define the source conductor lines and gate conductor lines 108) for visible light emitted from the backlight 116. One example of a material for both the second conductor patterns 12, 22 is a conductive indium-tin-oxide (ITO) compound. In contrast, the first conductor patterns 10, 20 at conductor levels A and B may, for example, comprise a metal or metal alloy layer, or a stack of metal/alloy layers. The first conductor patterns 10, 20 at conductor levels A and B may comprise different materials, or different combinations of materials.

Transparent conductor materials such as ITO typically exhibit very different work functions to metals or metal alloys, but there exist organic semiconductor materials (e.g., organic polymer organic materials) with which transparent conductor materials such as ITO exhibit good charge carrier transfer.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

What is claimed is:

1. A device, comprising:
   a substrate supporting a stack of layers, wherein the stack of layers defines:
   source conductors and pixel conductors at a first level;
   gate and common conductors at a second level; wherein the first level being between the second level and the substrate;
   semiconductor channels between the source conductors and pixel conductors; and
   one or more dielectric layers capacitively coupling the semiconductor channels to the gate conductors, wherein the common conductors are located higher in the stack than an uppermost dielectric layer of the one or more dielectric layers; and wherein the pixel conductors and common conductors are configured such that, in use, a change in potential difference between the pixel conductors and common conductors in a pixel region induces a change in one or more optical properties of a liquid crystal material in the pixel region, wherein the device comprises first and second conductor patterns at the first level, and wherein the first conductor pattern defines source conductor lines of the source conductors and the second conductor pattern defines the pixel conductors and extra parts of the source conductors between the source conductor lines and the semiconductor channels, and further wherein the extra parts are parts of the source conductors in closest proximity to the pixel conductors.

2. The device according to claim 1, comprising third and fourth conductor patterns at the second level, wherein the third and fourth conductor patterns have different designs and exhibit different optical and/or electrical properties.

3. The device according to claim 2, wherein the third conductor pattern defines the gate conductors; and the fourth conductor pattern defines the common conductors.

4. The device according to claim 3, wherein the third conductor pattern exhibits a higher electrical conductivity than the fourthsccond conductor pattern, and the fourth conductor pattern exhibits a higher visible light transmittance than the third conductor pattern.

5. The device according to claim 3, wherein the gate conductors comprise gate conductor lines, and the fourth conductor pattern is over the third conductor pattern in regions of the gate conductor lines.

6. The device according to claim 5, wherein the pixel conductors comprise pixel conductors for an array of pixels, and wherein the gate conductor lines extend from one edge of the array to an opposite edge of the array.

7. The device according to claim 1, wherein the first conductor pattern exhibits different optical and/or electrical properties to the second conductor pattern.

8. The device according to claim 7, wherein the second conductor pattern is formed over the first conductor pattern in regions of the source conductor lines.

9. The device according to claim 8, wherein the first conductor pattern exhibits a higher electrical conductivity than the second conductor pattern, and the second conductor pattern exhibits a higher visible light transmittance than the first conductor pattern.

10. A display device, comprising a liquid crystal material contained between a device according to claim 1 and a counter component; wherein the pixel and common conductors are configured such that, in use, a change in potential difference between pixel and common conductors in a pixel region induces a change in one or more optical properties of the liquid crystal material in the pixel region.

11. The device according to claim 1, wherein the common conductors located higher in the stack than the uppermost dielectric layer of the one or more dielectric layers comprise a set of spaced parallel sub-conductors located higher in the stack than the uppermost dielectric layer of the one or more dielectric layers.

12. The device according to claim 11, wherein the pixel conductor occupies at least all of the area directly beneath the sub-conductors and all of the area directly beneath spaces between the sub-conductors.

13. The device according to claim 1, wherein the common conductors are formed on the uppermost dielectric layer of the one or more dielectric layers.

14. The device according to claim 1, comprising a layer of charge-injection organic polymer material on the second conductor pattern.

15. The device according to claim 1, wherein the pixel conductors comprise pixel conductors for an array of pixels, and wherein the source conductor lines extend from one edge of the array to an opposite edge of the array.

16. The device according to claim 1, comprising a patterned semiconductor layer defining the semiconductor channels, and a patterned dielectric layer on the semiconductor layer;
   wherein the patterned semiconductor layer and the patterned dielectric layer have the same pattern.

17. The device according to claim 1, wherein the pixel conductors comprise pixel conductors for rows of pixels, and wherein the source conductor lines comprise source conductor lines for respective rows of the rows of pixels.

18. The device according to claim 1, wherein the pixel conductors and common conductors together provide fringe-field switching electrodes for an array of pixels.

* * * * *